United States Patent
Otsuka

(10) Patent No.: US 7,289,192 B2
(45) Date of Patent: Oct. 30, 2007

(54) PROJECTION EXPOSURE DEVICE

(75) Inventor: Akira Otsuka, Tokyo (JP)

(73) Assignee: Adtec Engineering Co., Ltd., Tokyo (JP)

( * ) Notice: Subject to any disclaimer, the term of this patent is extended or adjusted under 35 U.S.C. 154(b) by 480 days.

(21) Appl. No.: 10/899,816

(22) Filed: Jul. 27, 2004

(65) Prior Publication Data

US 2005/0041230 A1    Feb. 24, 2005

(30) Foreign Application Priority Data

Aug. 19, 2003    (JP) .............................. 2003-294819

(51) Int. Cl.
| | |
|---|---|
| G03B 27/42 | (2006.01) |
| G03B 27/52 | (2006.01) |
| G03B 27/54 | (2006.01) |
| G02B 26/00 | (2006.01) |
| G02B 21/00 | (2006.01) |
| G02B 3/12 | (2006.01) |

(52) U.S. Cl. ........................ 355/53; 355/55; 355/67; 359/292; 359/380; 359/666

(58) Field of Classification Search ................. 355/53, 355/55, 67; 359/292, 380, 666, 667
See application file for complete search history.

(56) References Cited

U.S. PATENT DOCUMENTS

| | | | | | |
|---|---|---|---|---|---|
| 4,676,631 | A | * | 6/1987 | Kosugi et al. ................ | 355/55 |
| 5,774,273 | A | * | 6/1998 | Bornhorst .................... | 359/665 |
| 6,295,118 | B1 | * | 9/2001 | Takeuchi ..................... | 355/52 |
| 6,738,195 | B2 | | 5/2004 | Matsumoto et al. ........ | 359/672 |
| 2003/0002169 | A1 | * | 1/2003 | Guy ........................... | 359/666 |

FOREIGN PATENT DOCUMENTS

JP    08-124831    5/1996

* cited by examiner

*Primary Examiner*—Alan Mathews
(74) *Attorney, Agent, or Firm*—Nields & Lemack

(57) ABSTRACT

A magnification correction device 1 includes magnification correction optics 2, a pressure adjustment device 3 and a controller 4. The magnification correction optics 2 is formed in a shape of a box with a glass plate 20 and a bottom plate 11 positioned parallel to the glass plate 20 and a frame 10. The inside of the box is an air room 24 connected to a pressure adjustment device 3 via a connecting pipe 12 so that the pressure of the inside can be changed. The cylinder 30 is driven by a motor 35 via a linear movement unit 36 such as a ball screw and the motor 35 is controlled by a controller 4. The moving distance of cylinder 30, which is equal to the moving distance of the piston, is decided by the number of the revolutions of the motor 35, and the capacity of the closed circuit of the pressure adjustment device 3 is also decided.

11 Claims, 5 Drawing Sheets

PROJECTION EXPOSURE DEVICE

BACKGROUND OF THE INVENTION

Field of the Invention and Related Art Statement

The invention relates to a projection exposure device.

The photolithography method has been applied widely in various fields, wherein a prescribed pattern is photographically imprinted by an exposure device on the surface of a printed circuit substrate coated with photosensitive materials such as the photo resist, thereafter the pattern is formed on the substrate by etching process. Printed circuit boards have also been fabricated by using an exposure device in recent years.

The projection exposure device is a type of depicting a circuit pattern of a photo mask on a printed circuit substrate in the same size as the mask or in certain magnification by projecting and exposing the pattern through an optical system such as the projection exposure lens or the like. It has been conventionally applied in the fabrication of integrated circuits, and in recent years, this projection exposure device has been tried in the fabrication of printed circuit boards.

With a demand for more and more high-speed, multi-functional, and miniaturized electronics devices, the printed circuit boards are also required to be more and more multi-layered, dense, and microscopic. Thus errors caused by expansion and contraction of the boards in producing process becomes no to be disregard.

In view of such circumstances, a magnification adjustment device is widely used in the projection exposure device so as to compensate expansion and contraction of the boards. Such magnification correcting device is typically shown in Japanese publication (Kokai) No.8-124831.

OBJECT OF THE INVENTION

Conventional devices for correcting magnification comprise a glass plate and the glass plate is mechanically bent to change the index of refraction. Some devices utilize lens optics and move the lenses to change magnification of the optics. However those conventional devices are complicated, expensive and of slow response.

An object of the invention is to provide a developed projection exposure device that effectively makes correction of magnification.

SUMMARY OF THE INVENTION

In the invention, the projection exposure device for manufacturing a printed circuit board by exposing a pattern onto a board comprises photo mask depicted with a pattern, a projecting means for projecting the pattern of the photo mask onto said board, a light source for emitting exposing light to expose the pattern depicted with said photo mask onto the board via said projecting means and a magnification correcting device positioned between said photo mask and said board for correcting the magnification of expansion or reduction of said pattern.

said magnification correcting device comprises a plate that is transparent for said exposing light, a closed space formed at one side of said plate, means for changing a pressure of said closed space and said plate being deformed by pressure changing of said closed space.

In the preferable embodiment said closed space is a box, one surface of which is said plate. An opposite side to the plate must be transparent for the exposing light and be more hard and less flexible than the plate so that only the plate can be deformed when the inside of the box is pressured.

In one embodiment said plate is cylindrically deformed, i.e. deformed in a shape that is part of a cylindrical shape. This deformation can be implemented by making said plate rectangular, opposite two edges thereof fixed and other opposite two edges free.

The plate can be deformed in various shapes, for example, said plate may be deformed in a shape that is part of a spherical shape. The plate is preferably in a shape of disk and circular edge of the plate is fixed for making part of a spherical shape.

The shape deformed of the plate can be variable by changing the fixed position at the edge thereof.

The projection exposure device may be provided with means for rotating said magnification correcting device against said board so as to change a direction of magnification correction. Said cylindrical deformation performs to correct magnification in one direction. However the direction of correction can be changed by rotating the device.

In the preferred embodiment, said means for changing a pressure of said closed space includes a cylinder connected to said closed space and a driving means for driving the cylinder. An air tank may be installed between said cylinder and said closed space. The cylinder can improve the response of pressure changing to practical level. Further with using the air tank, the pressure of the closed space can be precisely adjusted.

The projection exposure device of the invention can effectively make a correction of magnification.

DETAILED DESCRIPTION OF THE PREFERRED EMBODIMENTS

The invention will now be described in reference to the attached drawings.

Figure 1:
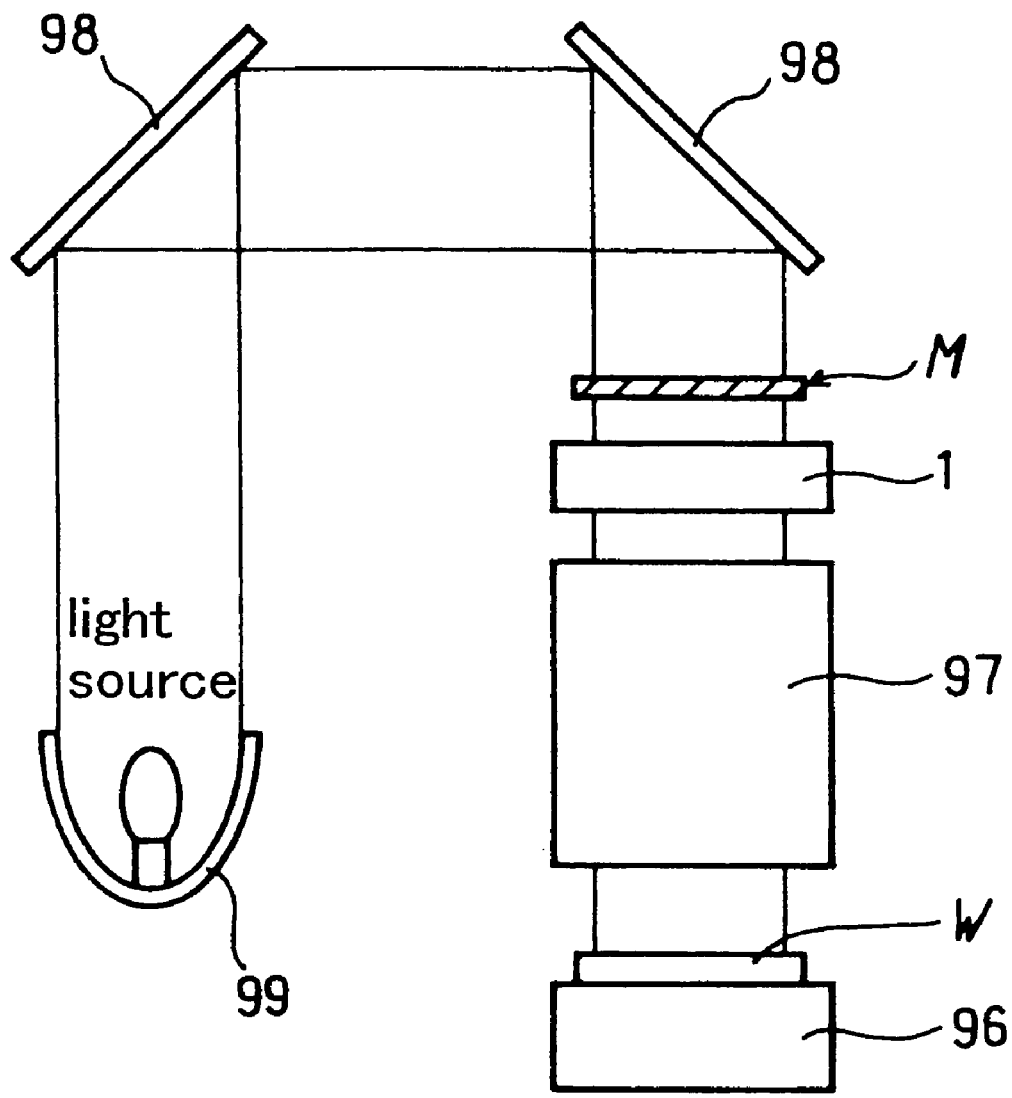
FIG. 1 shows a schematic view of an embodiment of the invention.

FIG. 1 shows a projection exposure device for producing printed circuit boards, wherein a board W provided with photo resist is loaded on a platen 96. The platen 96 is movable in X, Y, Z directions and rotatable in θ direction.

A mask M depicted with a circuit pattern is provided facing the board W, and the circuit pattern on the mask M will be imprinted on the board W by an exposing light from a light source 99.

A projection lens 97 is provided between the mask M and the board W, wherein patterns of the mask M are projected on the board W with enlargement or reduction at a certain magnification or without scaling at an original size.

98, 98 indicate mirrors.

In FIG. 1, optics of the mask M, a magnification correction device 1 and the projection lens 97, and the platen 96 are each installed horizontally in a flat plane and they are arranged in a vertical direction. However the arrangement is not limited to it. They may also be arranged in a reverse direction, or they may be each installed vertically and arranged in a horizontal direction.

Also, the optics of the mask M and others may be movable instead of the platen 96, or both of them may be movable.

Figure 2:
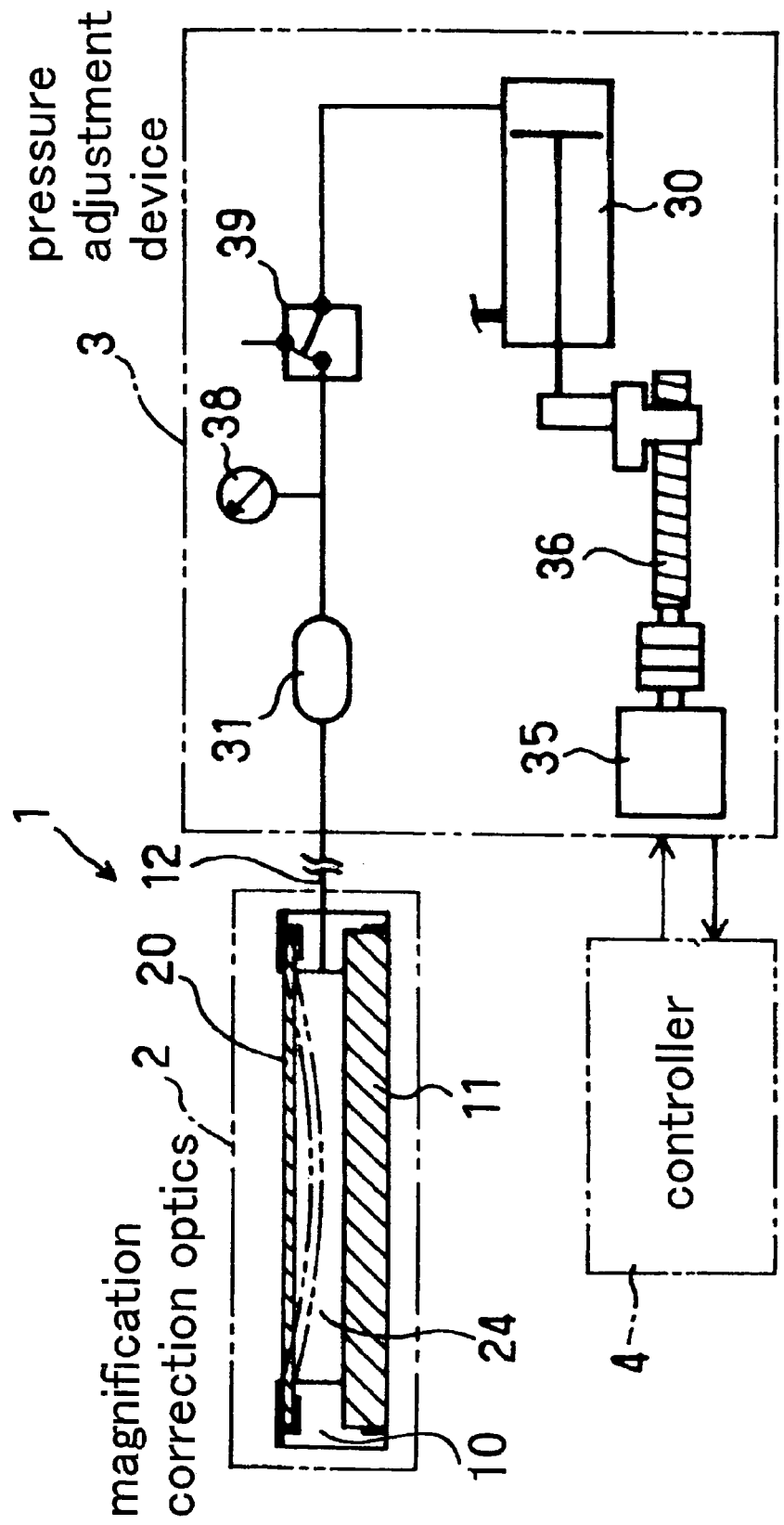
FIG. 2 shows an explanatory view of the magnification correction device 1 of the embodiment.

The structure of the magnification correction device 1 will be now described. As shown in FIG. 2, the magnification correction device 1 includes magnification correction optics 2, a pressure adjustment device 3 and a controller 4.

The magnification correction optics 2 is formed in a shape of a box with a glass plate 20 and a bottom plate 11 positioned parallel to the glass plate 20 and a frame 10. The inside of the box is an air room 24 connected to a pressure adjustment device 3 via a connecting pipe 12 so that the pressure of the inside can be changed.

The glass plate 20 is a plane parallel plate of a glass that an exposing light can penetrate. The bottom plate 11 is also a thick plane parallel plate of a glass that is also transparent for the exposing light.

The glass plate 20 is so thin that it is transformed corresponding to the pressure change in the air room 24, and the bottom plate 11 is so thick that it is not substantially transformed corresponding to the pressure change in the air room 24.

Figure 3:
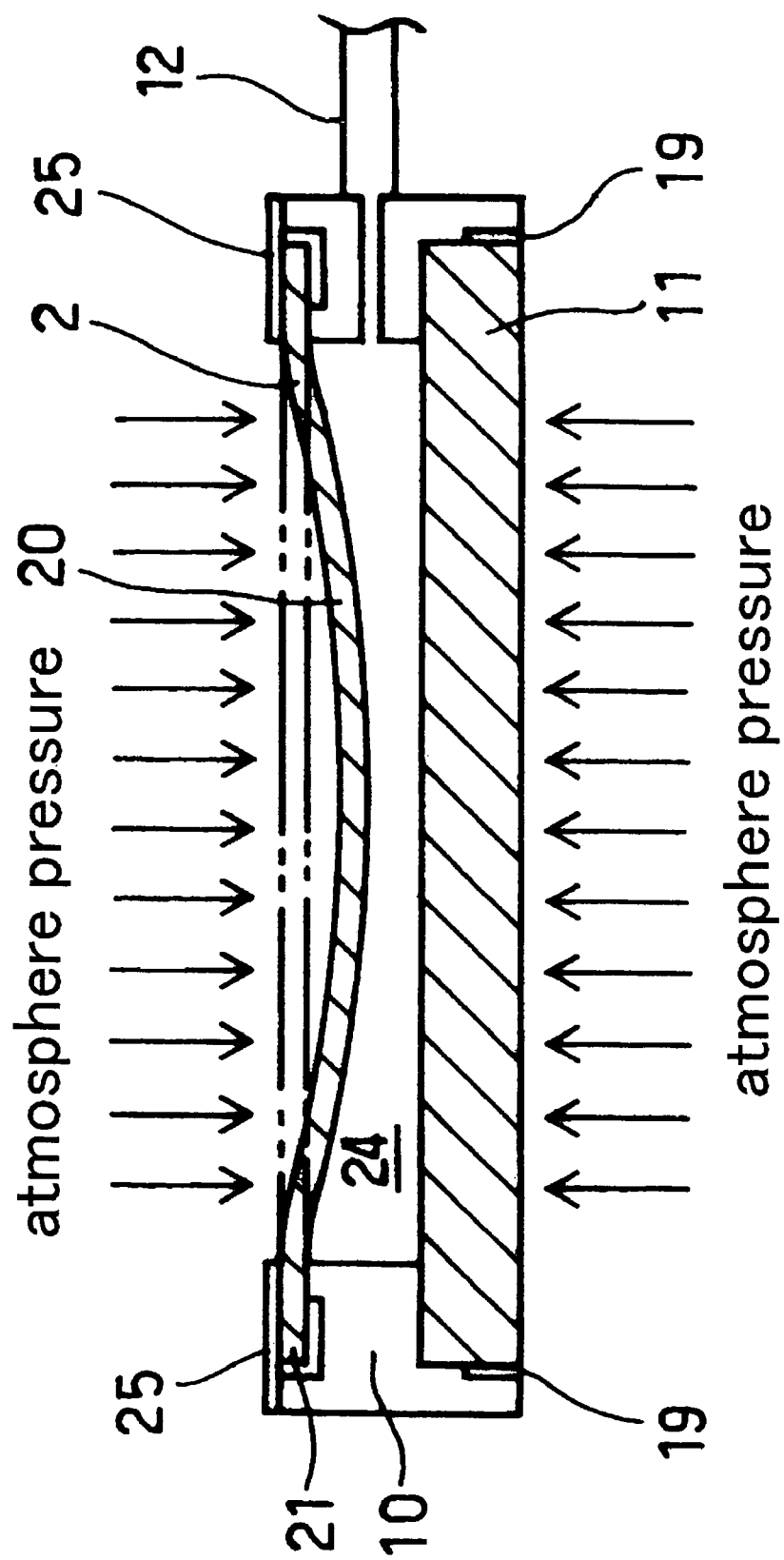
FIG. 3 shows an operation of the embodiment.
Figure 4:
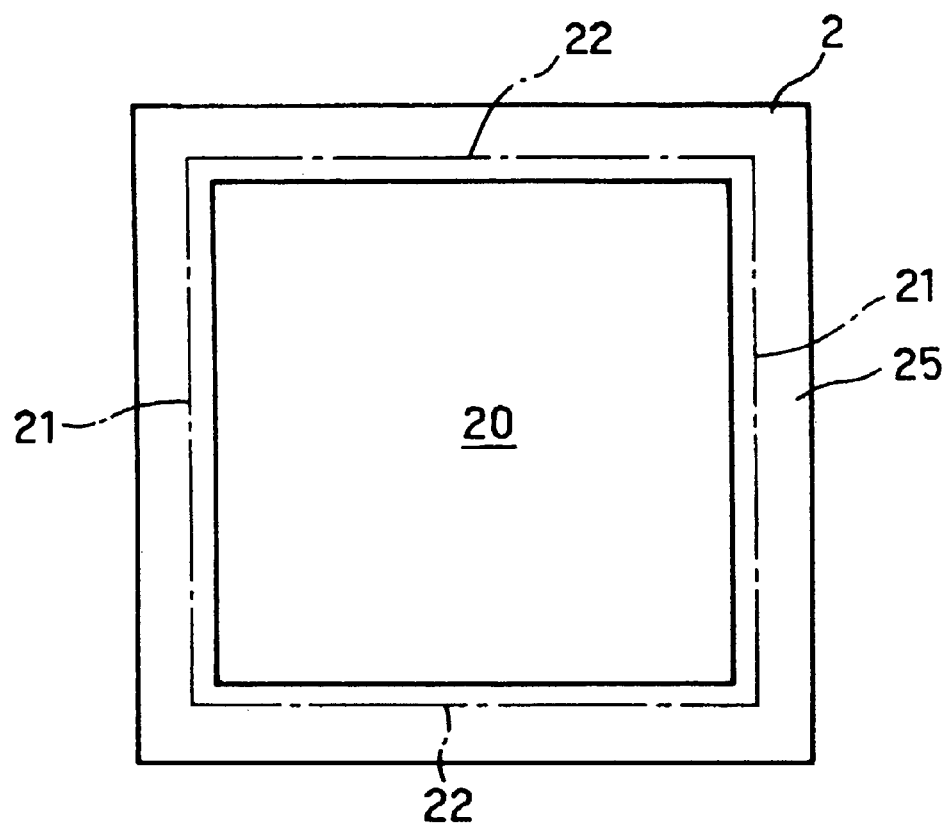
FIG. 4 shows a plan view of the magnification correction optics 2 of the embodiment.

As shown in FIGS. 3 and 4, the opposite two sides of the glass plate 20 are fixed sides 21 secured to the frame 10 and the glass plate 20 is restrained from being transformed along the fixed sides 21. As shown in FIG. 3, the fixed sides 21 are fixed via a seal sheet 25.

Figure 5:
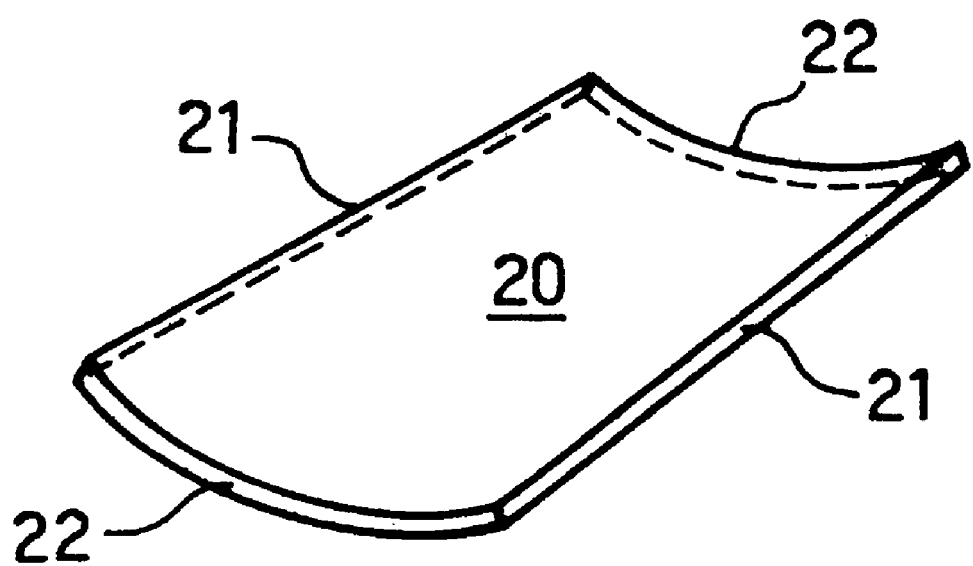
FIG. 5 shows a schematic view of one example of the deformed glass plate 20.

The other opposite sides of the glass plate 20 are free sides 22 which are not fixed to the frame 10, and the glass plate 20 is transformable along said sides 22. Thus the glass plate 20 of the embodiment is deformed cylindrically into a shape of part of cylinder as shown in FIG. 5.

It is possible to transform the glass plate 20 into a spherical shape when the glass plate 20 is circular and the circumference is entirely fixed. Other deformations of the glass plate 20 are also possible by variously changing the original shape of the glass plate 20 and the position fixed thereof.

A seal sheet 25 is provided around the edge of the glass plate 20 and the gap between the glass plate 20 and the frame 10 is sealed by the seal sheet 25. The gap between the bottom plate 11 and the frame 10 is also sealed by a seal member 19. These sealing makes the air room 24 an airtight space.

The pressure adjustment device 3 is, as described above, connected to the magnification correction optics 2 via the connecting pipe 12, and the pressure adjustment device 3 forms a closed circuit of air pressure with the magnification correction optics 2. The pressure adjustment device 3 includes a cylinder 30, which changes the capacity of said closed circuit and then changes the pressure in the air room 24. The cylinder 30 has a case tube and a piston reciprocally movable in the case tube and the volume of the tube is changed by the movement of the piston.

The cylinder 30 is driven by a motor 35 via a linear movement unit 36 such as a ball screw and the motor 35 is controlled by a controller 4. The moving distance of cylinder 30, which is equal to the moving distance of the piston, is decided by the number of the revolutions of the motor 35, and the capacity of the closed circuit of the pressure adjustment device 3 is also decided. The number of the revolutions of the motor 35 can be control by the electric signal from the controller 4.

An air tank 31, a pressure gage 38 and a switching valve 39 are provided between the cylinder 30 and the connecting pipe 12. The pressure gage 38 detects the pressure in the closed circuit and transfers the said pressure signal to the controller 4. The controller 4 controls the motor 35 in accordance with the said detected pressure.

The air tank 31 is used to increase the capacity of the closed circuit, and this makes the fine adjustment of the pressure possible.

39 is a valve for making the closed circuit open to the atmosphere. This switching valve 39 can switch the air circuit ordinarily closed to an open circuit open to the atmosphere by inputting the electric signal from the outside.

The cylinder 30, the switching valve 39, the air tank 31 and the pressure gage 38 mentioned above are connected each other by pipes such as resinous tubes or metallic pipes, and they all together compose the air pressure closed circuit, which leaks air a very little.

In the above composition, the adjustment of the pressure in the air room 24 is possible by driving the motor 35 and moving the cylinder 30 under the command from the controller 4. When the pressure in the air room 24 becomes under the air pressure, the transformation of the glass plate 20 comes out as shown in FIG. 3. Because of the transformation of the glass plate 20, the direction of the refraction of exposing light from the light source 99 shown in FIG. 1 will change, and the magnification of the projection will be changed thereby.

In this embodiment, the glass plate 20 is, as shown in FIG. 5, composed to be bent in the shape of par of a cylinder, however it is also possible to be bent in the shape of part of a spherical. Furthermore, it is also possible to be bent not in symmetrical but in unsymmetrical.

Furthermore, the magnification correction device 1 may be rotatably equipped so that the direction of the magnification correction can be changed by rotating the device 1 and also a plurality of the devices 1 may be used so as to make said direction of magnification correction multiple.

An equation to calculate the movements of the cylinder 30 from the designated pressure of the air room 24 in the above construction will be described.

The pressure in the air room 24 is equal to the pressure in the circuit of pressure adjustment device 3 connected to the air room 24. As mentioned above, these two spaces are closed circuits and their pressures are inversely proportional to the whole capacity (the sum of these two spaces), and this relation is shown in the equation below.

$$P/P1 = V1/V \tag{1}$$

P1: initial pressure in the circuit

V1: initial whole capacity

P: pressure in the circuit when the whole capacity comes to V.

Putting the variations of the pressure and the capacity as $\Delta P$ and $\Delta S$ respectively, P is expressed as $$P = P1 + \Delta P, \quad V = V1 + \Delta V$$

The equation 2 is derived by substituting above equation into Equation 1 and by rearranging.

$$\Delta V = (\Delta P \times V1)/(P1 + \Delta P) \tag{2}$$

The variation of the inner capacity $\Delta V$ can be expressed as the following equation 3.

$$\Delta V = \Delta Va + \Delta Vb \tag{3}$$

$\Delta Va$: variation of capacity produced by deforming of the glass plate 20 due to pressure changing.

$\Delta Vb$: variation of capacity of the cylinder 30 due to moving of the piston ΔV a is expressed as a function of ΔP and known, because the deformation value of the glass plate 20 is decided by difference between outside pressure and inside pressure.

Consequently, equation 4 is derived from the equations 2 and 3.

$$\Delta Vb = (\Delta P \times V1)/(P1 + \Delta P) - \Delta Va \qquad 4$$

A necessary variation value of the capacity by moving of the cylinder piston in order to perform the designated pressure is decided by the equation 4 and a value of the movement of the piston of the cylinder 30 can be easily calculated to satisfy the necessary variation value of the capacity.

The moving of the piston is controlled by the controller 4 via the motor 35 and the linear movement unit 36 and the piston will be moved by the instruction signal from the controller 4 to realize the designated pressure.

Before the movement of the piston, the switching valve 39 is changed to the position open to the atmosphere and the piston of the cylinder 30 is sifted to a position where the capacity of cylinder 30 is at least to keep the movable value of the piston at most.

The controller 4 checks the pressure of the circuit by the pressure gage 38 and finishes the operation when the difference between the detected value and the designated value reaches an allowable range. When the difference is more than allowable value, the controller 4 calculates a necessary movement to compensate the difference using the equation 4 and the piston moves again based on the calculation. Such operation will be repeated till the difference reaches the allowable value.

A little air leak from the closed space of the air room 24 and the pressure adjustment device 3 can be happened due to pressure difference from the atmosphere. The pressure changing caused by the leakage must be compensated and the pressure of the circuit must be kept constant, because the magnification correction must be kept constant during exposure operation. The correction operation of the pressure can be accomplished by detecting the pressure in the circuit by the pressure gage 38 and driving the cylinder based on the detected pressure until exposure operation ends.

From the equation 4, it is understood that ΔP decreases when V1 increases (the capacity of air tank 31 increases) with keeping ΔVb constant. By this it is obvious that resolving power of controlling the pressure can be easily developed by increasing the capacity of the air tank 31.

When the capacity of air tank 31 increases and the resolving power is developed, the piston of the cylinder 30 must move long for obtaining the same pressure change. This is a disadvantage for response speed. However the necessary pressure difference between the circuit and the atmosphere is actually a little and ordinary driving devices (the motor 35 and the linear movement unit 36) are enough to get moving speed of the piston to achieve substantial response speed.

The pressure adjustment device 3 makes the pressure in the air room 24 reach quickly the designated pressure and the response is developed. Thus the magnification correction of the projection exposure can be done at short time without obstructing production of boards. Furthermore, high resolving power of pressure designation can be accomplished by increasing the capacity of air tank 31 and the pressure adjustment device 3 realizes precise control of fine pressure, which cannot be implemented by prior devices such as a vacuum regulator.

What is claimed is:

1. A projection exposure device for manufacturing a printed circuit board by exposing a pattern onto a board, comprising:
    a photo mask depicted with a pattern,
    a projecting means for projecting the pattern of the photo mask onto said board,
    a light source for emitting exposing light to expose the pattern depicted with said photo mask onto the board via said projecting means,
    a magnification correcting device positioned between said photo mask and said board for correcting the magnification of expansion or reduction of said pattern; wherein, said magnification correcting device comprises,
    a plate that is transparent for said exposing light,
    a closed space formed at one side of said plate,
    means for changing a pressure of said closed space,
    wherein said plate is rectangular, opposite two edges thereof are fixed and other opposite two edges are free and is deformed by pressure changing of said closed space.

2. A projection exposure device of claim 1 wherein, said plate is deformed in a shape that is part of a cylindrical shape.

3. A projection exposure device of claim 1 wherein, deformation of said plate is variable.

4. A projection exposure device of claim 1 further comprising,
    means for rotating said magnification correcting device with respect to said board so as to change a direction of magnification correction.

5. A projection exposure device of claim 1, wherein said means for changing a pressure of said closed space includes,
    a cylinder connected to said closed space,
    a driving means for driving the cylinder.

6. A projection exposure device of claim 5 further comprising,
    an air tank installed between said cylinder and said closed space.

7. A projection exposure device for manufacturing a printed circuit board by exposing a pattern onto a board, comprising:
    a photo mask depicted with a pattern,
    a projecting means for projecting the pattern of the photo mask onto said board,
    a light source for emitting exposing light to expose the pattern depicted with said photo mask onto the board via said projecting means,
    a magnification correcting device positioned between said photo mask and said board for correcting the magnification of expansion or reduction of said pattern;
    means for rotating said magnification correcting device with respect to said board so as to change a direction of magnification correction,
    wherein said magnification correcting device comprises,
    a plate that is transparent for said exposing light,
    a closed space formed at one side of said plate,
    means for changing a pressure of said closed space,
    said plate being deformed by pressure changing of said closed space.

8. A projection exposure device of claim 7 wherein, said plate is deformed in a shape that is part of a cylindrical shape.

9. A projection exposure device of claim 7 wherein, deformation of said plate is variable.

10. A projection exposure device of claim 7, wherein said means for changing a pressure of said closed space includes,
a cylinder connected to said closed space,
a driving means for driving the cylinder.

11. A projection exposure device of claim 10 further comprising,
an air tank installed between said cylinder and said closed space.

* * * * *